(12) United States Patent
Chang

(10) Patent No.: US 7,239,529 B1
(45) Date of Patent: Jul. 3, 2007

(54) FIXING MEMBER FOR AUXILIARY CIRCUIT BOARD

(75) Inventor: Lin-Wei Chang, Taipei (TW)

(73) Assignee: Inventec Corporation (TW)

( * ) Notice: Subject to any disclaimer, the term of this patent is extended or adjusted under 35 U.S.C. 154(b) by 0 days.

(21) Appl. No.: 11/395,843

(22) Filed: Mar. 30, 2006

(51) Int. Cl.
*H05K 7/10* (2006.01)

(52) U.S. Cl. ............... 361/809; 361/807; 174/520; 174/535

(58) Field of Classification Search ............... 361/801, 361/742, 770, 758, 804, 807–810, 796, 788; 174/520, 521, 535; 439/59, 64, 374, 377
See application file for complete search history.

(56) References Cited

U.S. PATENT DOCUMENTS

| | | | | |
|---|---|---|---|---|
| 4,008,942 A | * | 2/1977 | Grossi .................. | 439/328 |
| 4,579,406 A | * | 4/1986 | Laursen et al. ........... | 439/62 |
| 5,267,125 A | * | 11/1993 | Liu ...................... | 361/816 |
| 5,453,017 A | * | 9/1995 | Belopolsky ............. | 439/83 |
| 5,494,451 A | * | 2/1996 | Bowers ................. | 439/328 |
| 5,872,701 A | * | 2/1999 | Hayden et al. .......... | 361/786 |
| 6,327,160 B1 | * | 12/2001 | Liao ................... | 361/809 |
| 6,769,927 B2 | * | 8/2004 | Brewer ................. | 439/328 |
| 6,815,614 B1 | * | 11/2004 | Keating et al. ......... | 174/535 |
| 7,145,085 B2 | * | 12/2006 | Keating et al. ......... | 174/520 |

* cited by examiner

*Primary Examiner*—Tuan Dinh
*Assistant Examiner*—Dameon E. Levi
(74) *Attorney, Agent, or Firm*—Peter F. Corless; Steven M. Jensen; Edwards Angell Palmer & Dodge LLP

(57) ABSTRACT

A fixing member for fixing an auxiliary circuit board to a main circuit board is proposed. The fixing member includes a fixing portion for being fixed to the main circuit board; and a combining portion connected to the fixing portion. The combining portion can be elastically deviated from its original position by the auxiliary circuit board while electrically connecting the auxiliary circuit board to the main circuit board. The combining portion can then return back to its original position by its restoring force after the auxiliary circuit board is electrically connected to the main circuit board. Thus, the auxiliary circuit board and the fixing member are combined together, thereby firmly fixing the auxiliary circuit board to the main circuit board.

9 Claims, 6 Drawing Sheets

FIXING MEMBER FOR AUXILIARY CIRCUIT BOARD

BACKGROUND OF THE INVENTION

1. Field of the Invention

The present invention relates to a fixing member for an auxiliary circuit board, and more particularly to a fixing member for fixing an auxiliary circuit board to a main circuit board of an electronic device.

2. Description of Related Art

As shown in FIGS. 1A and 1B, a conventional main circuit board 11 is provided with a plurality of electrical connectors 11a and a conventional auxiliary circuit board 12 is provided with a plurality of electrical terminals 12a. By inserting the electrical terminals 12a to the corresponding electrical connectors 11a, electrical connection between the main circuit board 11 and the auxiliary circuit board 12 can be established.

As the established electrical connection between the main circuit board 11 and the auxiliary circuit board 12 is only kept by a friction force generated between elastic conductive clips 11a' of the connectors 11a of the main circuit board 11 and the electrical terminals 12a of the auxiliary circuit board 12, the auxiliary circuit board 12 is easy to detach from the main circuit board 11 or loose electrical contact caused from damaged electrical connection between the auxiliary circuit board 12 and the main circuit board 11 often happens, thereby adversely affecting the signal transmission.

Accordingly, there is a need to develop a method so as to overcome the above defects.

SUMMARY OF THE INVENTION

According to the above defects, an objective of the present invention is to provide a fixing member which can firmly fix an auxiliary circuit board to a main circuit board so as to prevent the auxiliary circuit board from detaching from the main circuit board.

Another objective of the present invention is to provide a fixing member which can facilitate the assembly and disassembly of an auxiliary circuit board.

To achieve the above and other objectives, the present invention proposes a fixing member for an auxiliary circuit board, which can be used to fix the auxiliary circuit board to a main circuit board. The fixing member includes a fixing portion for fixing the fixing member to the main circuit board; and a combining portion connected to the fixing portion, wherein while electrically connecting the auxiliary circuit board to the main circuit board, the combining portion is elastically deviated from its original position by the auxiliary circuit board, after the auxiliary circuit board is electrically connected to the main circuit board, the combining portion returns back to its original position by its restoring force so as to combine the auxiliary circuit board and the fixing member together, thereby firmly fixing the auxiliary circuit board to the main circuit board.

Therefore, the conventional problems such as detachment of the auxiliary circuit board from the main circuit board and loose contact between the auxiliary circuit board and the main circuit board are solved.

DETAILED DESCRIPTION OF PREFERRED EMBODIMENTS

Hereunder, embodiments of the present invention will be described in full detail with reference to the accompanying drawings.

First Embodiment

Figure 1A:
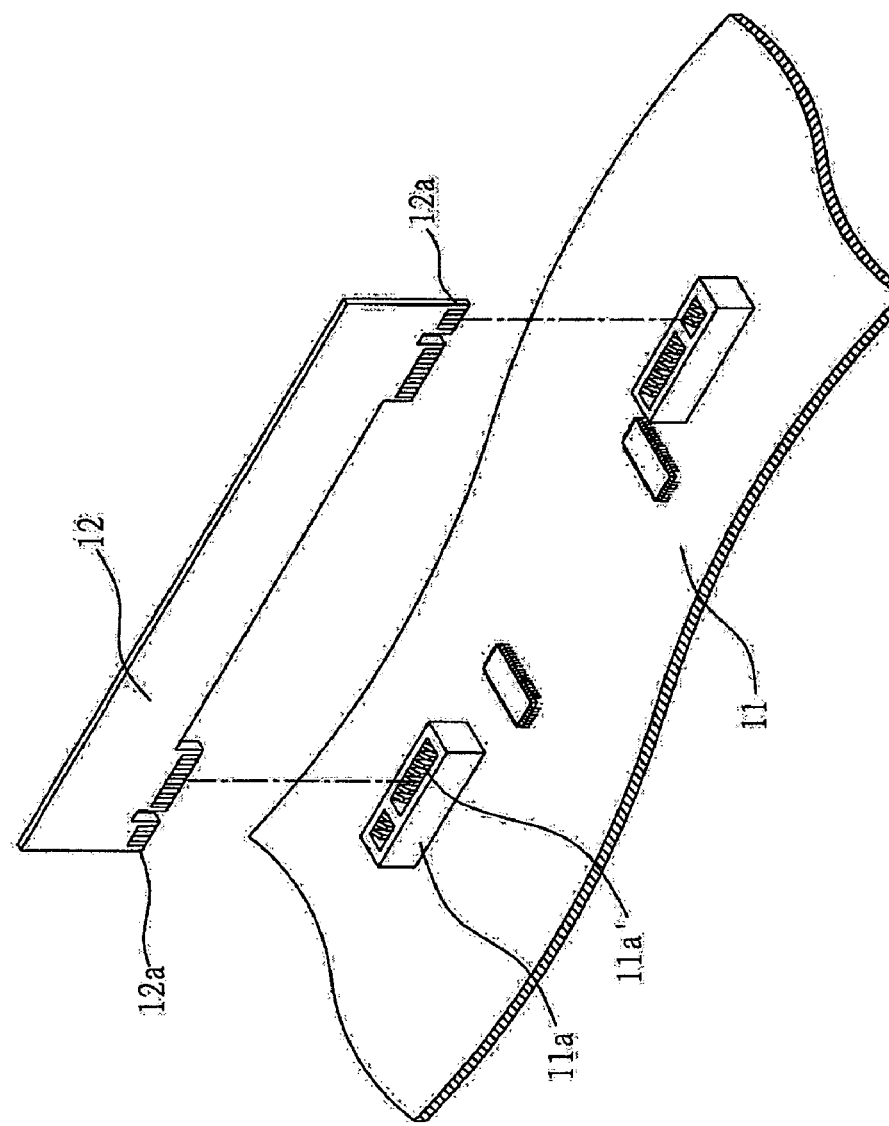
FIG. 1A is an exploded view of an auxiliary circuit board and a main circuit board of the prior art.
Figure 1B:
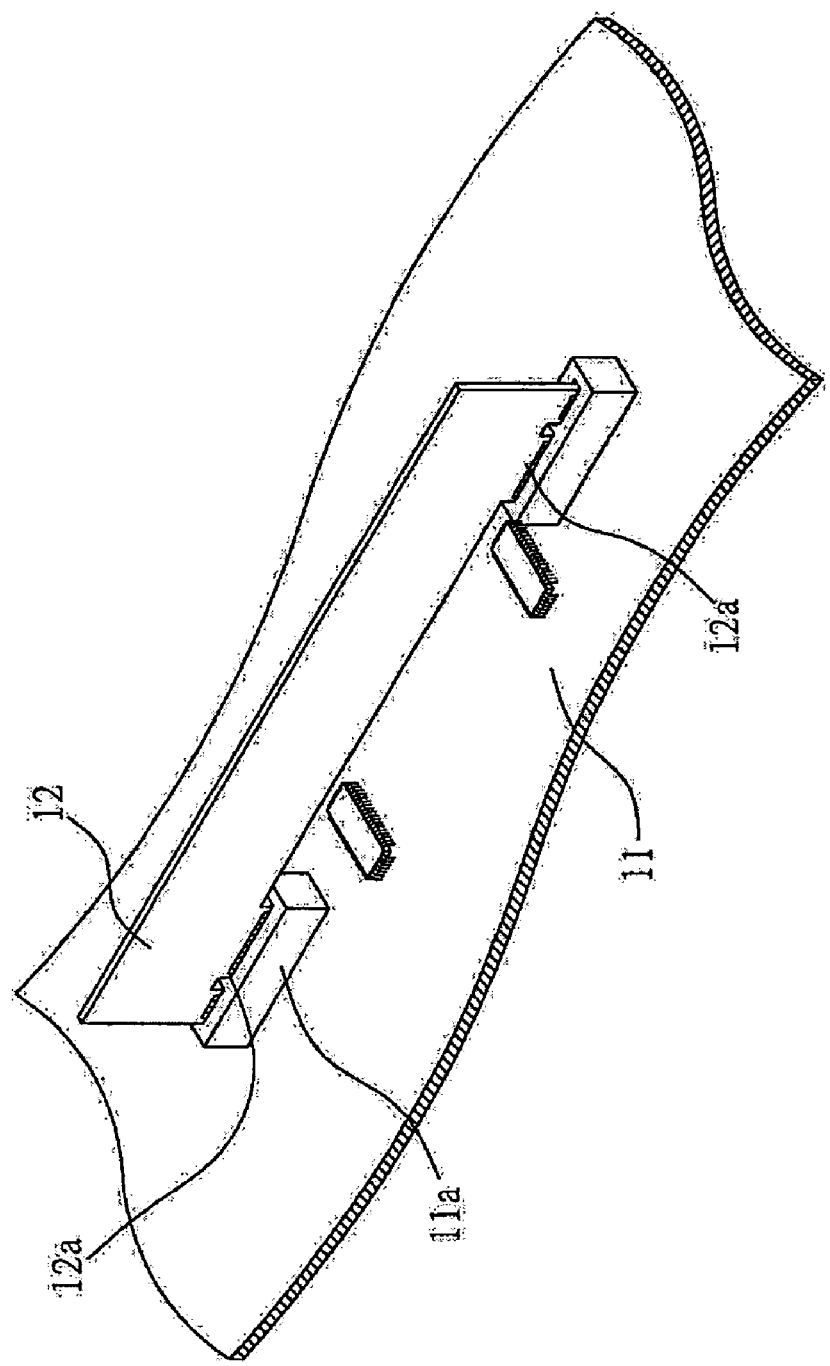
FIG. 1B is an assembly view of an auxiliary circuit board and a main circuit board of the prior art.
Figure 2B:
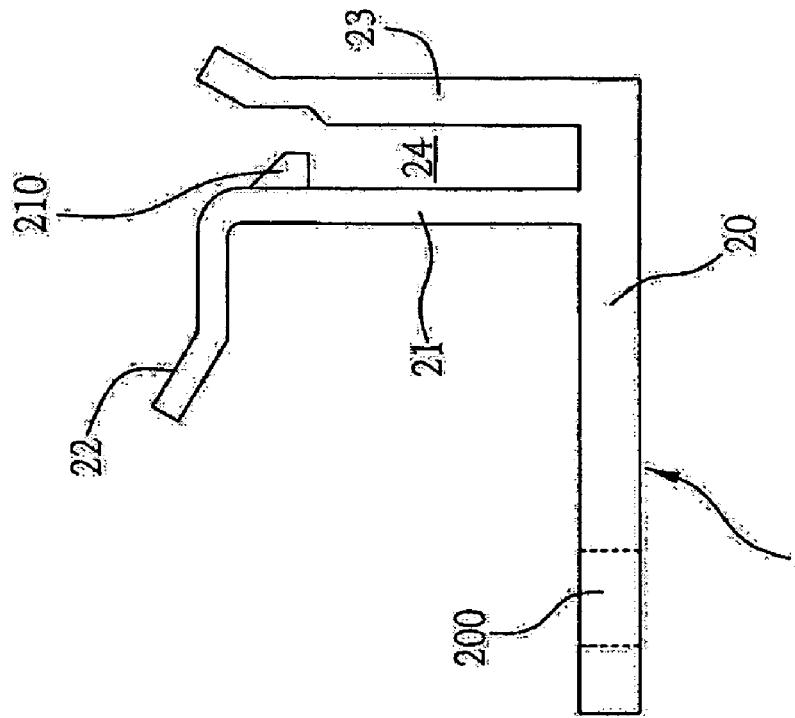
FIG. 2B is a side view of the fixing member for an auxiliary circuit board according to a first embodiment of the present invention.
Figure 2A:
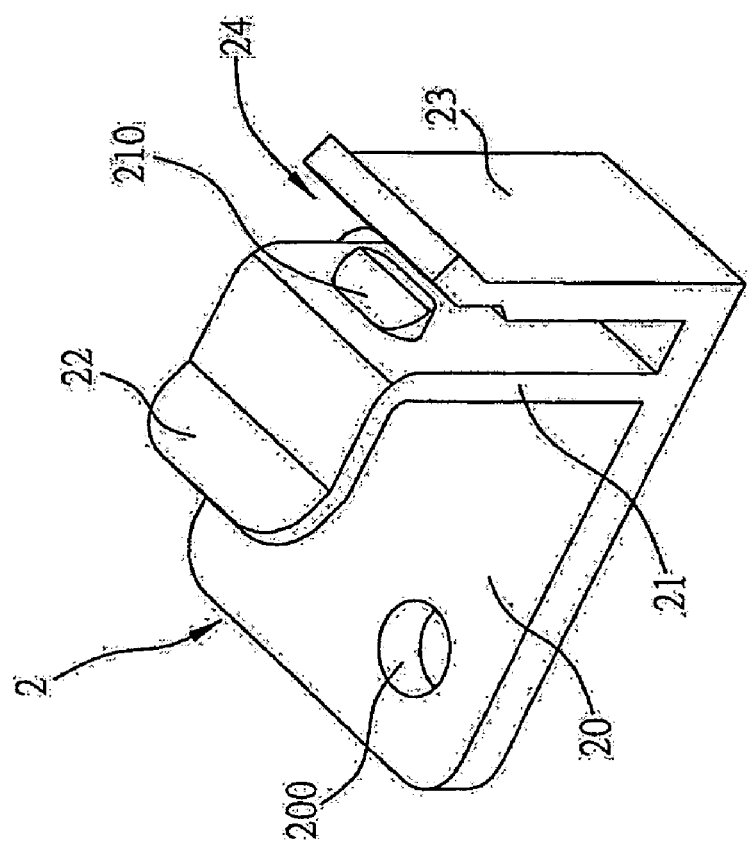
FIG. 2A is a perspective view of a fixing member for an auxiliary circuit board according to a first embodiment of the present invention.

FIGS. 2A and 2B show structure of a fixing member 2 for an auxiliary circuit board according to a first embodiment of the present invention. The fixing member 2 can be made of plastic material or metallic material. As shown in FIGS. 2A and 2B, the fixing member 2 comprises a fixing portion 20 with an opening 200 and a combining portion 21 perpendicularly extending from the fixing portion 20, wherein the combining portion 21 can be elastically deviated from its original position, thereby forming a non-right angle with respect to the fixing portion 20. The combining portion 21 further comprises a protruding portion 210 formed on a surface thereof and a pressing portion 22 formed on the top thereof. Meanwhile, a stopping portion 23 extends from the fixing portion 20 in the same direction as the combining portion 21 and is spaced apart from the combining portion 21 such that a guiding slot 24 can be formed between the stopping portion 23 and the combining portion 21.

Figure 3A:
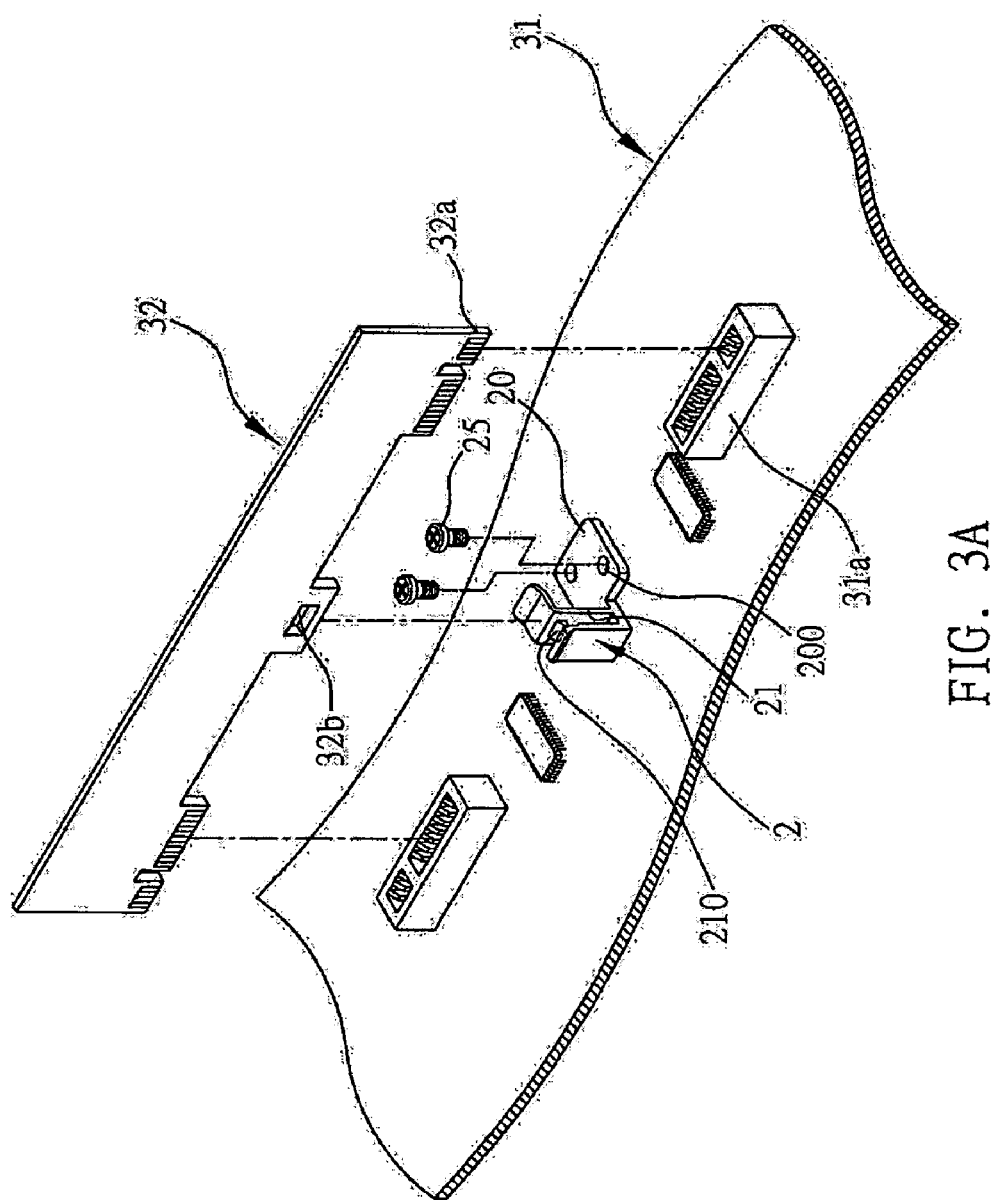
FIG. 3A is an exploded view of a fixing member, an auxiliary circuit board and a main board according to a first embodiment of the present invention.
Figure 3B:
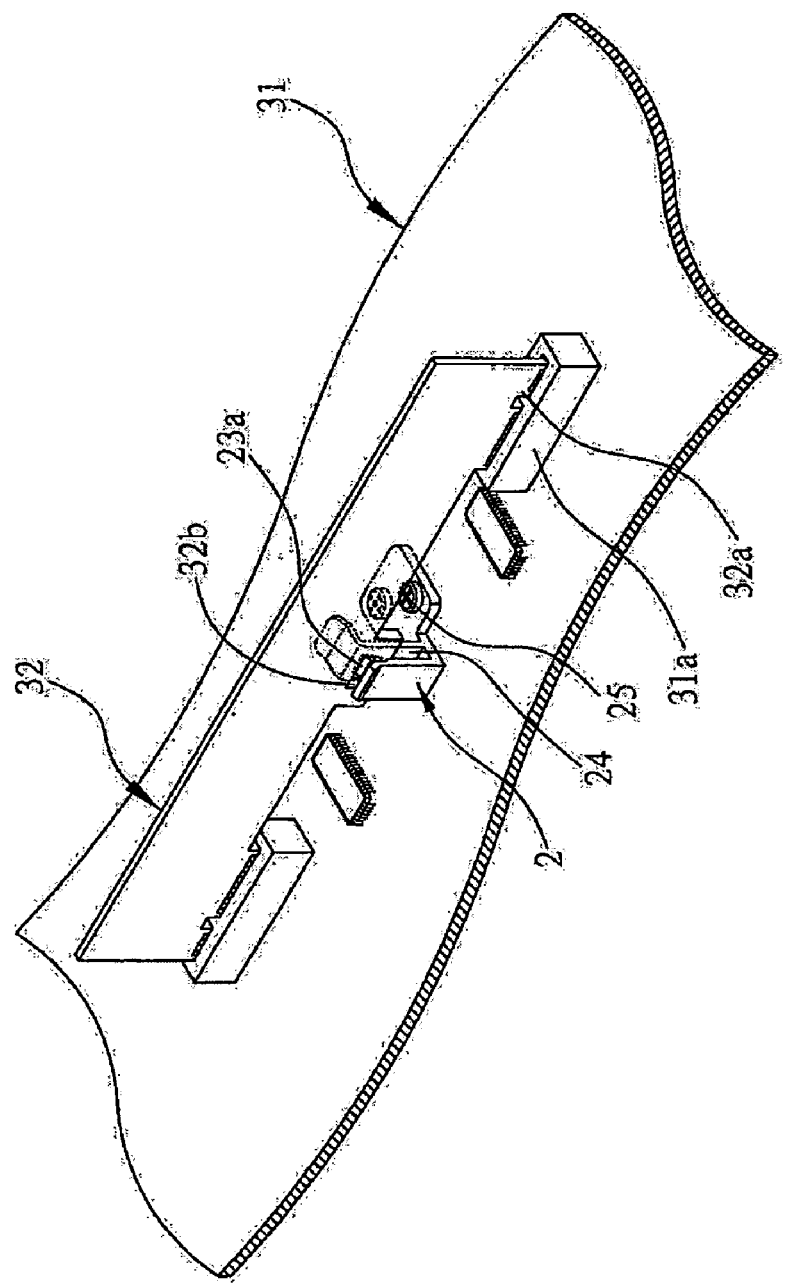
FIG. 3B is an assembly view of the fixing member, the auxiliary circuit board and the main board according to a first embodiment of the present invention.

FIGS. 3A and 3B show the steps of assembling an auxiliary circuit board to a main circuit board by using the fixing member 2 of the present embodiment. Referring to FIGS. 3A and 3B, the main circuit board 31 is provided with at least one electrical connector 31a and the auxiliary circuit board 32 is provided with at least one electrical terminal 32a which can be electrically connected to the electrical connector 31a of the main circuit board 31. Further, a through hole 32b is formed in the auxiliary circuit board 32.

A locking member 25 such as a screw bolt or an expansion bolt is passed through the opening 200 of the fixing portion 20 of the fixing member 2 and locked into the main circuit board 31. Thus, the fixing member 2 is fixed to the main circuit board 31. It should be noted that the fixing method for fixing the fixing member 2 to the main circuit board 31 is not limited to the present embodiment.

As shown in FIG. 3B, while the electrical terminal 32a of the auxiliary circuit board 32 is inserted to the connector 31a of the main circuit board 31 for electrical connection, a portion of the auxiliary circuit board 31 is inserted into the guiding slot 24, which causes the combining portion 21 of the fixing member 2 to be deviated from its original position until the protruding portion 210 of the fixing member 2 engages with the opening 32b of the auxiliary circuit board 32. Then, the connecting portion 21 returns back to its original position by its own restoring force. Thereby, the auxiliary circuit board 32 is firmly engaged to the fixing member 2. Thus, the fixing state between the auxiliary circuit board 32 and the main circuit board 31 is strengthened through the fixing member 2, thereby avoiding conventional problems such as detachment of the auxiliary circuit board 32 from the main circuit board 31 and loose electrical contact between the auxiliary circuit board 32 and the main circuit board 31.

On the other hand, to remove the auxiliary circuit board 32 from the main circuit board 31, pushing the pressing portion 22 on the combining portion 21 of the fixing member 2 can make the protruding portion 210 of the fixing member 2 disengage from the opening 32b of the auxiliary circuit board 32. Thereafter, the auxiliary circuit board 32 can easily be removed from the main circuit board 31.

Second Embodiment

Figure 4:
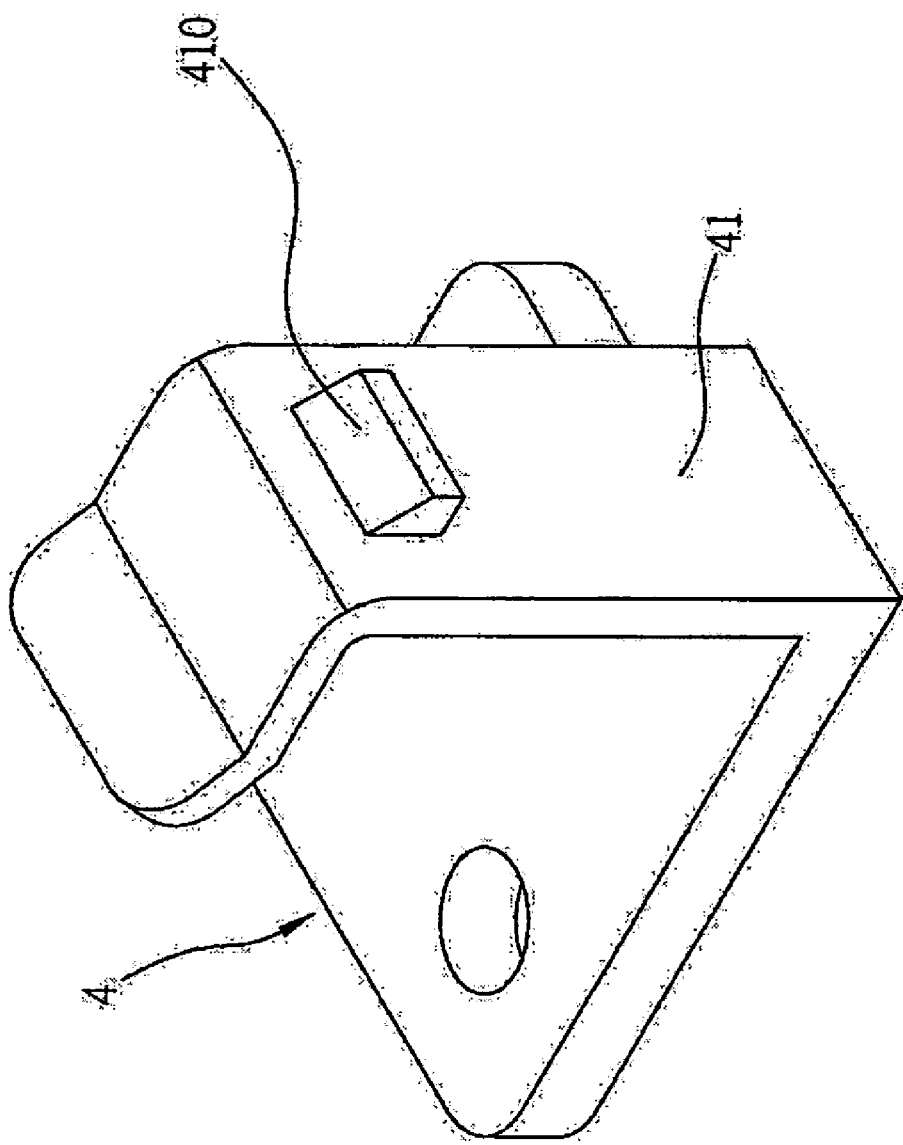
FIG. 4 is a perspective view of a fixing member for an auxiliary circuit board according to a second embodiment of the present invention.

FIG. 4 shows structure of a fixing member 4 according to a second embodiment of the present invention. Although there is no stopping portion disposed on the fixing member 4 as that is disposed on the fixing member 2 of the first embodiment, the auxiliary circuit board 32 can still be firmly fixed to the main circuit board 31 by using the protruding portion 410 of the combining portion 41 of the fixing member 4. Compared with the fixing member 3, the structure of the fixing member 4 is much simpler.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fixing member for fixing an auxiliary circuit board to a main circuit board, a through hole being formed in the auxiliary circuit board, the fixing member comprising:

a fixing portion for being fixed to the main circuit board;
a combining portion connected to the fixing portion and capable of being elastically deviated in position in relation to the fixing portion; and
a protruding portion formed on a surface of the combining portion,
wherein when the auxiliary circuit board is being electrically connected to the main circuit board and coupled to the fixing member, the combining portion is elastically deviated from its original position by the auxiliary circuit board, and after the auxiliary circuit board is electrically connected to the main circuit board, the combining portion returns back to its original position by its restoring force to let the protruding portion engage with the through hole of the auxiliary circuit board so as to combine the auxiliary circuit board and the fixing member together, thereby firmly fixing the auxiliary circuit board to the main circuit board.

2. The fixing member of claim 1, wherein a pressing portion is further formed on a top portion of the combining portion.

3. The fixing member of claim 1, wherein a stopping portion is further formed on the fixing portion and is spaced apart from the combining portion such that a guiding slot is formed between the combining portion and the stopping portion.

4. The fixing member of claim 3, wherein the guiding slot allows the auxiliary circuit board to be inserted therein.

5. The fixing member of claim 1, wherein the combining portion is integrally formed with the fixing portion.

6. The fixing member of claim 1, wherein the fixing member is made of one of a plastic material and a metallic material.

7. The fixing member of claim 3, wherein the stopping portion is parallel to the combining portion.

8. The fixing member of claim 1, wherein the fixing portion comprises an opening which allows a locking member to pass such that the fixing member is fixed to the main circuit board.

9. The fixing member of claim 8, wherein the locking member is one of a screw bolt and an expansion bolt.

* * * * *